(12) United States Patent
Gorrell et al.

(10) Patent No.: US 7,586,167 B2
(45) Date of Patent: Sep. 8, 2009

(54) DETECTING PLASMONS USING A METALLURGICAL JUNCTION

(75) Inventors: Jonathan Gorrell, Gainesville, FL (US); Mark Davidson, Florahome, FL (US)

(73) Assignee: Virgin Islands Microsystems, Inc., St. Thomas, VI (US)

( * ) Notice: Subject to any disclaimer, the term of this patent is extended or adjusted under 35 U.S.C. 154(b) by 0 days.

(21) Appl. No.: 11/418,084

(22) Filed: May 5, 2006

(65) Prior Publication Data

US 2007/0257328 A1 Nov. 8, 2007

(51) Int. Cl.
*H01L 29/96* (2006.01)
(52) U.S. Cl. .................... 257/431; 257/E31.115
(58) Field of Classification Search ............. 257/440, 257/461, 431, E31.115
See application file for complete search history.

(56) References Cited

U.S. PATENT DOCUMENTS

| | | | |
|---|---|---|---|
| 1,948,384 A | 2/1934 | Lawrence |
| 2,307,086 A | 1/1943 | Varian et al. |
| 2,431,396 A | 11/1947 | Hansell |
| 2,473,477 A | 6/1949 | Smith |
| 2,634,372 A | 4/1953 | Salisbury |
| 2,932,798 A | 4/1960 | Kerst et al. |
| 2,944,183 A | 7/1960 | Drexler |
| 2,966,611 A | 12/1960 | Sandstrom |
| 3,231,779 A | 1/1966 | White |
| 3,297,905 A | 1/1967 | Rockwell et al. |
| 3,315,117 A | 4/1967 | Udelson |
| 3,387,169 A | 6/1968 | Farney |
| 3,543,147 A | 11/1970 | Kovarik |
| 3,546,524 A | 12/1970 | Stark |
| 3,560,694 A | 2/1971 | White |
| 3,571,642 A | 3/1971 | Westcott |
| 3,586,899 A | 6/1971 | Fleisher |
| 3,761,828 A | 9/1973 | Pollard et al. |
| 3,886,399 A | 5/1975 | Symons |
| 3,923,568 A | 12/1975 | Bersin |
| 3,989,347 A | 11/1976 | Eschler |
| 4,053,845 A | 10/1977 | Gould |
| 4,282,436 A | 8/1981 | Kapetanakos |

(Continued)

FOREIGN PATENT DOCUMENTS

EP 0237559 B1 12/1991

(Continued)

OTHER PUBLICATIONS

"Array of Nanoklystrons for Frequency Agility or Redundancy," NASA's Jet Propulsion Laboratory, NASA Tech Briefs, NPO-21033. 2001.

(Continued)

*Primary Examiner*—Minh-Loan T Tran
*Assistant Examiner*—W. Wendy Kuo
(74) *Attorney, Agent, or Firm*—Davidson Berquist Jackson & Gowdey LLP

(57) ABSTRACT

A sensor device includes a substrate having first and second regions of first and second conductivity types, respectively. A junction having a band-gap is formed between the first and second regions. A plasmon source generates plasmons having fields. At least a portion of the plasmon source is formed near the junction, and the fields reduce the band-gap to enable a current to flow through the device.

10 Claims, 8 Drawing Sheets

U.S. PATENT DOCUMENTS

| | | | |
|---|---|---|---|
| 4,450,554 A | 5/1984 | Steensma et al. | |
| 4,482,779 A * | 11/1984 | Anderson | 136/255 |
| 4,528,659 A | 7/1985 | Jones, Jr. | |
| 4,589,107 A | 5/1986 | Middleton et al. | |
| 4,598,397 A | 7/1986 | Nelson et al. | |
| 4,630,262 A | 12/1986 | Callens et al. | |
| 4,652,703 A | 3/1987 | Lu et al. | |
| 4,661,783 A | 4/1987 | Gover et al. | |
| 4,704,583 A | 11/1987 | Gould | |
| 4,712,042 A | 12/1987 | Hamm | |
| 4,713,581 A | 12/1987 | Haimson | |
| 4,727,550 A | 2/1988 | Chang et al. | |
| 4,740,963 A | 4/1988 | Eckley | |
| 4,740,973 A | 4/1988 | Madey | |
| 4,746,201 A | 5/1988 | Gould | |
| 4,761,059 A | 8/1988 | Yeh et al. | |
| 4,782,485 A | 11/1988 | Gollub | |
| 4,789,945 A | 12/1988 | Niijima | |
| 4,806,859 A | 2/1989 | Hetrick | |
| 4,809,271 A | 2/1989 | Kondo et al. | |
| 4,813,040 A | 3/1989 | Futato | |
| 4,819,228 A | 4/1989 | Baran et al. | |
| 4,829,527 A | 5/1989 | Wortman et al. | |
| 4,838,021 A | 6/1989 | Beattie | |
| 4,841,538 A | 6/1989 | Yanabu et al. | |
| 4,864,131 A | 9/1989 | Rich et al. | |
| 4,866,704 A | 9/1989 | Bergman | |
| 4,866,732 A | 9/1989 | Carey et al. | |
| 4,873,715 A | 10/1989 | Shibata | |
| 4,887,265 A | 12/1989 | Felix | |
| 4,890,282 A | 12/1989 | Lambert et al. | |
| 4,898,022 A | 2/1990 | Yumoto et al. | |
| 4,912,705 A | 3/1990 | Paneth et al. | |
| 4,932,022 A | 6/1990 | Keeney et al. | |
| 4,981,371 A | 1/1991 | Gurak et al. | |
| 5,023,563 A | 6/1991 | Harvey et al. | |
| 5,036,513 A | 7/1991 | Greenblatt | |
| 5,065,425 A | 11/1991 | Lecomte et al. | |
| 5,113,141 A | 5/1992 | Swenson | |
| 5,121,385 A | 6/1992 | Tominaga et al. | |
| 5,127,001 A | 6/1992 | Steagall et al. | |
| 5,128,729 A | 7/1992 | Alonas et al. | |
| 5,130,985 A | 7/1992 | Kondo et al. | |
| 5,150,410 A | 9/1992 | Bertrand | |
| 5,155,726 A | 10/1992 | Spinney et al. | |
| 5,157,000 A | 10/1992 | Elkind et al. | |
| 5,163,118 A | 11/1992 | Lorenzo et al. | |
| 5,185,073 A | 2/1993 | Bindra | |
| 5,187,591 A | 2/1993 | Guy et al. | |
| 5,199,918 A | 4/1993 | Kumar | |
| 5,214,650 A | 5/1993 | Renner et al. | |
| 5,233,623 A | 8/1993 | Chang | |
| 5,235,248 A | 8/1993 | Clark et al. | |
| 5,262,656 A | 11/1993 | Blondeau et al. | |
| 5,263,043 A | 11/1993 | Walsh | |
| 5,268,693 A | 12/1993 | Walsh | |
| 5,268,788 A | 12/1993 | Fox et al. | |
| 5,282,197 A | 1/1994 | Kreitzer | |
| 5,283,819 A | 2/1994 | Glick et al. | |
| 5,293,175 A | 3/1994 | Hemmie et al. | |
| 5,302,240 A | 4/1994 | Hori et al. | |
| 5,305,312 A | 4/1994 | Fornek et al. | |
| 5,341,374 A | 8/1994 | Lewen et al. | |
| 5,354,709 A | 10/1994 | Lorenzo et al. | |
| 5,446,814 A | 8/1995 | Kuo et al. | |
| 5,504,341 A | 4/1996 | Glavish | |
| 5,578,909 A | 11/1996 | Billen | |
| 5,604,352 A | 2/1997 | Schuetz | |
| 5,608,263 A | 3/1997 | Drayton et al. | |
| 5,663,971 A | 9/1997 | Carlsten | |
| 5,666,020 A | 9/1997 | Takemura | |
| 5,668,368 A | 9/1997 | Sakai et al. | |
| 5,705,443 A | 1/1998 | Stauf et al. | |
| 5,737,458 A | 4/1998 | Wojnarowski et al. | |
| 5,744,919 A | 4/1998 | Mishin et al. | |
| 5,757,009 A | 5/1998 | Walstrom | |
| 5,767,013 A | 6/1998 | Park | |
| 5,780,970 A | 7/1998 | Singh et al. | |
| 5,790,585 A | 8/1998 | Walsh | |
| 5,811,943 A | 9/1998 | Mishin et al. | |
| 5,821,836 A | 10/1998 | Katehi et al. | |
| 5,821,902 A | 10/1998 | Keen | |
| 5,825,140 A | 10/1998 | Fujisawa | |
| 5,831,270 A | 11/1998 | Nakasuji | |
| 5,847,745 A | 12/1998 | Shimizu et al. | |
| 5,889,449 A | 3/1999 | Fiedziuszko | |
| 5,889,797 A | 3/1999 | Nguyen | |
| 5,902,489 A | 5/1999 | Yasuda et al. | |
| 5,963,857 A | 10/1999 | Greywall | |
| 6,005,347 A | 12/1999 | Lee | |
| 6,008,496 A | 12/1999 | Winefordner et al. | |
| 6,040,625 A | 3/2000 | Ip | |
| 6,060,833 A | 5/2000 | Velazco | |
| 6,080,529 A | 6/2000 | Ye et al. | |
| 6,139,760 A | 10/2000 | Shim et al. | |
| 6,180,415 B1 | 1/2001 | Schultz et al. | |
| 6,195,199 B1 | 2/2001 | Yamada | |
| 6,222,866 B1 | 4/2001 | Seko | |
| 6,278,239 B1 | 8/2001 | Caporaso et al. | |
| 6,281,769 B1 | 8/2001 | Fiedziuszko | |
| 6,297,511 B1 | 10/2001 | Syllaios et al. | |
| 6,301,041 B1 | 10/2001 | Yamada | |
| 6,316,876 B1 | 11/2001 | Tanabe | |
| 6,338,968 B1 | 1/2002 | Hefti | |
| 6,370,306 B1 | 4/2002 | Sato et al. | |
| 6,373,194 B1 | 4/2002 | Small | |
| 6,376,258 B2 | 4/2002 | Hefti | |
| 6,407,516 B1 | 6/2002 | Victor | |
| 6,441,298 B1 * | 8/2002 | Thio | 136/250 |
| 6,448,850 B1 | 9/2002 | Yamada | |
| 6,453,087 B2 | 9/2002 | Frish et al. | |
| 6,470,198 B1 | 10/2002 | Kintaka et al. | |
| 6,504,303 B2 | 1/2003 | Small | |
| 6,525,477 B2 | 2/2003 | Small | |
| 6,534,766 B2 | 3/2003 | Abe et al. | |
| 6,545,425 B2 | 4/2003 | Victor | |
| 6,552,320 B1 * | 4/2003 | Pan | 250/208.1 |
| 6,577,040 B2 | 6/2003 | Nguyen | |
| 6,580,075 B2 | 6/2003 | Kametani et al. | |
| 6,603,781 B1 | 8/2003 | Stinson et al. | |
| 6,603,915 B2 | 8/2003 | Glebov et al. | |
| 6,624,916 B1 | 9/2003 | Green et al. | |
| 6,636,185 B1 | 10/2003 | Spitzer et al. | |
| 6,636,534 B2 | 10/2003 | Madey et al. | |
| 6,636,653 B2 | 10/2003 | Miracky et al. | |
| 6,640,023 B2 | 10/2003 | Miller et al. | |
| 6,642,907 B2 | 11/2003 | Hamada et al. | |
| 6,687,034 B2 | 2/2004 | Wine et al. | |
| 6,724,486 B1 | 4/2004 | Shull et al. | |
| 6,738,176 B2 | 5/2004 | Rabinowitz et al. | |
| 6,741,781 B2 | 5/2004 | Furuyama | |
| 6,782,205 B2 | 8/2004 | Trisnadi et al. | |
| 6,791,438 B2 | 9/2004 | Takahashi et al. | |
| 6,800,877 B2 | 10/2004 | Victor et al. | |
| 6,801,002 B2 | 10/2004 | Victor et al. | |
| 6,819,432 B2 | 11/2004 | Pepper et al. | |
| 6,829,286 B1 | 12/2004 | Guilfoyle et al. | |
| 6,834,152 B2 | 12/2004 | Gunn et al. | |
| 6,870,438 B1 | 3/2005 | Shino et al. | |
| 6,871,025 B2 | 3/2005 | Levi et al. | |
| 6,885,262 B2 | 4/2005 | Nishimura et al. | |
| 6,900,447 B2 | 5/2005 | Gerlach et al. | |
| 6,909,092 B2 | 6/2005 | Nagahama | |
| 6,909,104 B1 | 6/2005 | Koops | |

| Patent/Pub No. | Date | Name |
|---|---|---|
| 6,924,920 B2 | 8/2005 | Zhilkov |
| 6,936,981 B2 | 8/2005 | Gesley |
| 6,943,650 B2 | 9/2005 | Ramprasad et al. |
| 6,944,369 B2 | 9/2005 | Deliwala |
| 6,952,492 B2 | 10/2005 | Tanaka et al. |
| 6,953,291 B2 | 10/2005 | Liu |
| 6,954,515 B2 | 10/2005 | Bjorkholm et al. |
| 6,965,284 B2 | 11/2005 | Maekawa et al. |
| 6,965,625 B2 | 11/2005 | Mross et al. |
| 6,972,439 B1 | 12/2005 | Kim et al. |
| 6,995,406 B2 | 2/2006 | Tojo et al. |
| 7,010,183 B2 | 3/2006 | Estes et al. |
| 7,064,500 B2 | 6/2006 | Victor et al. |
| 7,068,948 B2 | 6/2006 | Wei et al. |
| 7,092,588 B2 | 8/2006 | Kondo |
| 7,092,603 B2 | 8/2006 | Glebov et al. |
| 7,122,978 B2 | 10/2006 | Nakanishi et al. |
| 7,130,102 B2 | 10/2006 | Rabinowitz |
| 7,177,515 B2 | 2/2007 | Estes et al. |
| 7,230,201 B1 | 6/2007 | Miley et al. |
| 7,253,426 B2 | 8/2007 | Gorrell et al. |
| 7,267,459 B2 | 9/2007 | Matheson |
| 7,267,461 B2 | 9/2007 | Kan et al. |
| 7,309,953 B2 | 12/2007 | Tiberi et al. |
| 7,342,441 B2 | 3/2008 | Gorrell et al. |
| 7,362,972 B2 | 4/2008 | Yavor et al. |
| 7,375,631 B2 | 8/2008 | Moskowitz et al. |
| 7,436,177 B2 | 10/2008 | Gorrell et al. |
| 7,442,940 B2 | 10/2008 | Gorrell et al. |
| 7,443,358 B2 | 10/2008 | Gorrell et al. |
| 7,470,920 B2 | 12/2008 | Gorrell et al. |
| 7,473,917 B2 | 1/2009 | Singh |
| 2001/0025925 A1 | 10/2001 | Abe et al. |
| 2002/0009723 A1 | 1/2002 | Hefti |
| 2002/0027481 A1 | 3/2002 | Fiedziuszko |
| 2002/0036121 A1 | 3/2002 | Ball et al. |
| 2002/0036264 A1 | 3/2002 | Nakasuji et al. |
| 2002/0053638 A1 | 5/2002 | Winkler et al. |
| 2002/0068018 A1 | 6/2002 | Pepper et al. |
| 2002/0070671 A1 | 6/2002 | Small |
| 2002/0071457 A1 | 6/2002 | Hogan |
| 2002/0135665 A1 | 9/2002 | Gardner |
| 2002/0191650 A1 | 12/2002 | Madey et al. |
| 2003/0010979 A1 | 1/2003 | Pardo |
| 2003/0012925 A1 | 1/2003 | Gorrell |
| 2003/0016412 A1 | 1/2003 | Small |
| 2003/0016421 A1 | 1/2003 | Small |
| 2003/0034535 A1 | 2/2003 | Barenburu et al. |
| 2003/0103150 A1* | 6/2003 | Catrysse et al. ............ 348/272 |
| 2003/0106998 A1 | 6/2003 | Colbert et al. |
| 2003/0155521 A1 | 8/2003 | Feuerbaum |
| 2003/0158474 A1 | 8/2003 | Scherer et al. |
| 2003/0164947 A1 | 9/2003 | Vaupel |
| 2003/0179974 A1 | 9/2003 | Estes et al. |
| 2003/0206708 A1 | 11/2003 | Estes et al. |
| 2003/0214695 A1 | 11/2003 | Abramson et al. |
| 2004/0061053 A1 | 4/2004 | Taniguchi et al. |
| 2004/0080285 A1 | 4/2004 | Victor et al. |
| 2004/0085159 A1 | 5/2004 | Kubena et al. |
| 2004/0092104 A1 | 5/2004 | Gunn, III et al. |
| 2004/0108471 A1 | 6/2004 | Luo et al. |
| 2004/0108473 A1 | 6/2004 | Melnychuk et al. |
| 2004/0136715 A1 | 7/2004 | Kondo |
| 2004/0150991 A1 | 8/2004 | Ouderkirk et al. |
| 2004/0171272 A1 | 9/2004 | Jin et al. |
| 2004/0180244 A1 | 9/2004 | Tour et al. |
| 2004/0184270 A1 | 9/2004 | Halter |
| 2004/0213375 A1 | 10/2004 | Bjorkholm et al. |
| 2004/0217297 A1 | 11/2004 | Moses et al. |
| 2004/0218651 A1 | 11/2004 | Iwasaki et al. |
| 2004/0231996 A1 | 11/2004 | Webb |
| 2004/0240035 A1 | 12/2004 | Zhilkov |
| 2004/0264867 A1 | 12/2004 | Kondo |
| 2005/0023145 A1 | 2/2005 | Cohen et al. |
| 2005/0045821 A1 | 3/2005 | Noji et al. |
| 2005/0045832 A1 | 3/2005 | Kelly et al. |
| 2005/0054151 A1 | 3/2005 | Lowther et al. |
| 2005/0067286 A1 | 3/2005 | Ahn et al. |
| 2005/0082469 A1 | 4/2005 | Carlo |
| 2005/0092929 A1 | 5/2005 | Schneiker |
| 2005/0104684 A1 | 5/2005 | Wojcik |
| 2005/0105690 A1 | 5/2005 | Pau et al. |
| 2005/0145882 A1 | 7/2005 | Taylor et al. |
| 2005/0152635 A1 | 7/2005 | Paddon et al. |
| 2005/0162104 A1 | 7/2005 | Victor et al. |
| 2005/0190637 A1 | 9/2005 | Ichimura et al. |
| 2005/0194258 A1 | 9/2005 | Cohen et al. |
| 2005/0201707 A1 | 9/2005 | Glebov et al. |
| 2005/0201717 A1 | 9/2005 | Matsumura et al. |
| 2005/0212503 A1 | 9/2005 | Deibele |
| 2005/0231138 A1 | 10/2005 | Nakanishi et al. |
| 2005/0249451 A1 | 11/2005 | Baehr-Jones et al. |
| 2005/0285541 A1 | 12/2005 | LeChevalier |
| 2006/0007730 A1 | 1/2006 | Nakamura et al. |
| 2006/0018619 A1 | 1/2006 | Helffrich et al. |
| 2006/0035173 A1 | 2/2006 | Davidson et al. |
| 2006/0045418 A1 | 3/2006 | Cho et al. |
| 2006/0050269 A1 | 3/2006 | Brownell |
| 2006/0060782 A1 | 3/2006 | Khursheed |
| 2006/0062258 A1 | 3/2006 | Brau et al. |
| 2006/0131695 A1 | 6/2006 | Kuekes et al. |
| 2006/0159131 A1 | 7/2006 | Liu et al. |
| 2006/0164496 A1 | 7/2006 | Tokutake et al. |
| 2006/0187794 A1 | 8/2006 | Harvey et al. |
| 2006/0208667 A1 | 9/2006 | Lys et al. |
| 2006/0216940 A1 | 9/2006 | Gorrell et al. |
| 2006/0243925 A1 | 11/2006 | Barker et al. |
| 2006/0274922 A1 | 12/2006 | Ragsdale |
| 2007/0003781 A1 | 1/2007 | de Rochemont |
| 2007/0013765 A1 | 1/2007 | Hudson et al. |
| 2007/0075264 A1 | 4/2007 | Gorrell et al. |
| 2007/0086915 A1 | 4/2007 | LeBoeuf et al. |
| 2007/0116420 A1 | 5/2007 | Estes et al. |
| 2007/0146704 A1 | 6/2007 | Schmidt et al. |
| 2007/0152176 A1 | 7/2007 | Gorrell et al. |
| 2007/0154846 A1 | 7/2007 | Gorrell et al. |
| 2007/0194357 A1 | 8/2007 | Oohashi et al. |
| 2007/0200940 A1* | 8/2007 | Gruhlke et al. .............. 348/272 |
| 2007/0252983 A1 | 11/2007 | Tong et al. |
| 2007/0258690 A1 | 11/2007 | Gorrell et al. |
| 2007/0264023 A1 | 11/2007 | Gorrell et al. |
| 2007/0264030 A1 | 11/2007 | Gorrell et al. |
| 2007/0284527 A1 | 12/2007 | Zani et al. |
| 2008/0069509 A1 | 3/2008 | Gorrell et al. |
| 2008/0302963 A1 | 12/2008 | Nakasuji et al. |

FOREIGN PATENT DOCUMENTS

| | | |
|---|---|---|
| JP | 2004-32323 A | 1/2004 |
| WO | WO 87/01873 | 3/1987 |
| WO | WO 93/21663 A1 | 10/1993 |
| WO | WO 00/72413 | 11/2000 |
| WO | WO 02/25785 | 3/2002 |
| WO | WO 02/077607 | 10/2002 |
| WO | WO 2004/086560 | 10/2004 |
| WO | WO 2005/015143 A2 | 2/2005 |
| WO | WO 2005/098966 | 10/2005 |
| WO | WO 2006/042239 A2 | 4/2006 |

OTHER PUBLICATIONS

"Hardware Development Programs," Calabazas Creek Research, Inc. found at http://calcreek.com/hardware.html.

"Antenna Arrays." May 18, 2002. www.tpub.com/content/neets/14183/css/14183_159.htm.

"Diffraction Grating," hyperphysics.phy-astr.gsu.edu/hbase/phyopt/grating.html.

Alford, T.L. et al., "Advanced silver-based metallization patterning for ULSI applications," Microelectronic Engineering 55, 2001, pp. 383-388, Elsevier Science B.V.

Amato, Ivan, "An Everyman's Free-Electron Laser?" Science, New Series, Oct. 16, 1992, p. 401, vol. 258 No. 5081, American Association for the Advancement of Science.

Andrews, H.L. et al., "Dispersion and Attenuation in a Smith-Purcell Free Electron Laser," The American Physical Society, Physical Review Special Topics—Accelerators and Beams 8 (2005), pp. 050703-1-050703-9.

Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.

Bakhtyari, A. et al., "Horn Resonator Boosts Miniature Free-Electron Laser Power," Applied Physics Letters, May 12, 2003, pp. 3150-3152, vol. 82, No. 19, American Institute of Physics.

Bakhtyari, Dr. Arash, "Gain Mechanism in a Smith-Purcell MicroFEL," Abstract, Department of Physics and Astronomy, Dartmouth College.

Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.

Booske, J.H. et al., "Microfabricated TWTs as High Power, Wideband Sources of THz Radiation".

Brau, C.A. et al., "Gain and Coherent Radiation from a Smith-Purcell Free Electron Laster," Proceedings of the 2004 FEL Conference, pp. 278-281.

Brownell, J.H. et al., "Improved μFEL Performance with Novel Resonator," Jan. 7, 2005, from website: www.frascati.enea.it/thz-bridge/workshop/presentations/Wednesday/We-07-Brownell.ppt.

Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.

Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.

Chuang, S.L. et al., "Smith-Purcell Radiation from a Charge Moving Above a Penetrable Grating," IEEE MTT-S Digest, 1983, pp. 405-406, IEEE.

Far-IR, Sub-MM & MM Detector Technology Workshop list of manuscripts, session 6 2002.

Feltz, W.F. et al., "Near-Continuous Profiling of Temperature, Moisture, and Atmospheric Stability Using the Atmospheric Emitted Radiance Interferometer (AERI)," Journal of Applied Meteorology, May 2003, vol. 42 No. 5, H.W. Wilson Company, pp. 584-597.

Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.

Gallerano, G.P. et al., "Overview of Terahertz Radiation Sources," Proceedings of the 2004 FEL Conference, pp. 216-221.

Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.

Gover, A. et al., "Angular Radiation Pattern of Smith-Purcell Radiation," Journal of the Optical Society of America, Oct. 1984, pp. 723-728, vol. 1 No. 5, Optical Society of America.

Grishin, Yu. A. et al., "Pulsed Orotron—A New Microwave Source for Submillimeter Pulse High-Field Electron Paramagnetic Resonance Spectroscopy," Review of Scientific Instruments, Sep. 2004, pp. 2926-2936, vol. 75 No. 9, American Institute of Physics.

Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.

Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.

Ives, Lawrence et al., "Development of Backward Wave Oscillators for Terahertz Applications," Terahertz for Military and Security Applications, Proceedings of SPIE vol. 5070 (2003), pp. 71-82.

Ives, R. Lawrence, "IVEC Summary, Session 2, Sources I" 2002.

Jonietz, Erika, "Nano Antenna Gold nanospheres show path to all-optical computing," Technology Review, Dec. 2005/Jan. 2006, p. 32.

Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA Nov. 1995 pp. 117-121.

Joo, Youngcheol et al., "Fabrication of Monolithic Microchannels for IC Chip Cooling," 1995, Mechanical, Aerospace and Nuclear Engineering Department, University of California at Los Angeles.

Jung, K.B. et al., "Patterning of Cu, Co, Fe, and Ag for magnetic nanostructures," J. Vac. Sci. Technol. A 15(3), May/Jun. 1997, pp. 1780-1784.

Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.

Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.

Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.

Korbly, S.E. et al., "Progress on a Smith-Purcell Radiation Bunch Length Diagnostic," Plasma Science and Fusion Center, MIT, Cambridge, MA.

Kormann, T. et al., "A Photoelectron Source for the Study of Smtih-Purcell Radiation".

Kube, G. et al., "Observation of Optical Smith-Purcell Radiation at an Electron Beam Energy of 855 MeV," Physical Review E, May 8, 2002, vol. 65, The American Physical Society, pp. 056501-1-056501-15.

Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.

Manohara, Harish et al., "Field Emission Testing of Carbon Nanotubes for THz Frequency Vacuum Microtube Sources." Abstract. Dec. 2003. from SPIEWeb.

Manohara, Harish M. et al., "Design and Fabrication of a THz Nanoklystron".

Manohara, Harish M. et al., "Design and Fabrication of a THz Nanoklystron" (www.sofia.usra.edu/det_workshop/ posters/session 3/3-43manohara_poster.pdf), PowerPoint Presentation.

McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.

Meyer, Stephan, "Far IR, Sub-MM & MM Detector Technology Workshop Summary," Oct. 2002. (may date the Manohara documents).

Mokhoff, Nicolas, "Optical-speed light detector promises fast space talk," EETimes Online, Mar. 20, 2006, from website: www.eetimes.com/showArticle.jhtml?articleID=183701047.

Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.

Nguyen, Phucanh et al., "Reactive ion etch of patterned and blanket silver thin films in Cl2/O2 and O2 glow discharges," J. Vac. Sci, Tehcnol. B. 17 (5), Sep./Oct. 1999, American Vacuum Society, pp. 2204-2209.

Ohtaka, Kazuo, "Smith-Purcell Radiation from Metallic and Dielectric Photonic Crystals," Center for Frontier Science, pp. 272-273, Chiba University, 1-33 Yayoi, Inage-ku, Chiba-shi, Japan.

Photonics Research, "Surface-Plasmon-Enhanced Random Laser Demonstrated," Phototonics Spectra, Feb. 2005, pp. 112-113.

Platt, C.L. et al., "A New Resonator Design for Smith-Purcell Free Electron Lasers," 6Q19, p. 296.

Potylitsin, A.P., "Resonant Diffraction Radiation and Smith-Purcell Effect," (Abstract), arXiv: physics/9803043 v2 Apr. 13, 1998.

Potylitsyn, A.P., "Resonant Diffraction Radiation and Smith-Purcell Effect," Physics Letters A, Feb. 2, 1998, pp. 112-116, A 238, Elsevier Science B.V.

S. Hoogland et al., "A solution-processed 1.53 μm quantum dot laser with temperature-invariant emission wavelength," Optics Express, vol. 14, No. 8, Apr. 17, 2006, pp. 3273-3281.

Savilov, Andrey V., "Stimulated Wave Scattering in the Smith-Purcell FEL," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.

Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.

Schachter, Levi, "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.

Shih, I. et al., "Experimental Investigations of Smith-Purcell Radiation," Journal of the Optical Society of America, Mar. 1990, pp. 351-356, vol. 7, No. 3, Optical Society of America.

Shih, I. et al., "Measurements of Smith-Purcell Radiation," Journal of the Optical Society of America, Mar. 1990, pp. 345-350, vol. 7 No. 3, Optical Society of America.

Swartz, J.C. et al., "THz-FIR Grating Coupled Radiation Source," Plasma Science, 1998. 1D02, p. 126.

Temkin, Richard, "Scanning with Ease Through the Far Infrared," Science, New Series, May 8, 1998, p. 854, vol. 280, No. 5365, American Association for the Advancement of Science.

Walsh, J.E., et al., 1999. From website: http://www.ieee.org/organizations/pubs/newsletters/leos/feb99/hot2.htm.

Wentworth, Stuart M. et al., "Far-Infrared Composite Microbolometers," IEEE MTT-S Digest, 1990, pp. 1309-1310.

Yamamoto, N. et al., "Photon Emission From Silver Particles Induced by a High-Energy Electron Beam," Physical Review B, Nov. 6, 2001, pp. 205419-1-205419-9, vol. 64, The American Physical Society.

Yokoo, K. et al., "Smith-Purcell Radiation at Optical Wavelength Using a Field-Emitter Array," Technical Digest of IVMC, 2003, pp. 77-78.

Zeng, Yuxiao et al., "Processing and encapsulation of silver patterns by using reactive ion etch and ammonia anneal," Materials Chemistry and Physics 66, 2000, pp. 77-82.

Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.

Markoff, John, "A Chip That Can Transfer Data Using Laser Light," The New York Times, Sep. 18, 2006.

S.M. Sze, "Semiconductor Devices Physics and Technology", 2nd Edition, Chapter 9 and 12, Copyright 1985, 2002.

Search Report and Written Opinion mailed Feb. 12, 2007 in PCT Appln. No. PCT/US2006/022682.

Search Report and Written Opinion mailed Feb. 20, 2007 in PCT Appln. No. PCT/US2006/022676.

Search Report and Written Opinion mailed Feb. 20, 2007 in PCT Appln. No. PCT/US2006/022772.

Search Report and Written Opinion mailed Feb. 20, 2007 in PCT Appln. No. PCT/US2006/022780.

Search Report and Written Opinion mailed Feb. 21, 2007 in PCT Appln. No. PCT/US2006/022684.

Search Report and Written Opinion mailed Jan. 17, 2007 in PCT Appln. No. PCT/US2006/022777.

Search Report and Written Opinion mailed Jan. 23, 2007 in PCT Appln. No. PCT/US2006/022781.

Search Report and Written Opinion mailed Mar. 7, 2007 in PCT Appln. No. PCT/US2006/022775.

Speller et al., "A Low-Noise MEMS Accelerometer for Unattended Ground Sensor Applications", Applied MEMS Inc., 12200 Parc Crest, Stafford, TX, USA 77477.

Thurn-Albrecht et al., "Ultrahigh-Density Nanowire Arrays Grown in Self-Assembled Diblock Copolymer Templates", Science 290. 5499, Dec. 15, 2000, pp. 2126-2129.

Search Report and Written Opinion mailed Apr. 23, 2008 in PCT Appln. No. PCT/US2006/022678.

Search Report and Written Opinion mailed Apr. 3, 2008 in PCT Appln. No. PCT/US2006/027429.

Search Report and Written Opinion mailed Jun. 18, 2008 in PCT Appln. No. PCT/US2006/027430.

Search Report and Written Opinion mailed Jun. 3, 2008 in PCT Appln. No. PCT/US2006/022783.

Search Report and Written Opinion mailed Mar. 24, 2008 in PCT Appln. No. PCT/US2006/022677.

Search Report and Written Opinion mailed Mar. 24, 2008 in PCT Appln. No. PCT/US2006/022784.

Search Report and Written Opinion mailed May 2, 2008 in PCT Appln. No. PCT/US2006/023280.

Search Report and Written Opinion mailed May 21, 2008 in PCT Appln. No. PCT/US2006/023279.

Search Report and Written Opinion mailed May 22, 2008 in PCT Appln. No. PCT/US2006/022685.

International Search Report and Written Opinion mailed Nov. 23, 2007 in International Application No. PCT/US2006/022786.

Search Report and Written Opinion mailed Oct. 25, 2007 in PCT Appln. No. PCT/US2006/022687.

Search Report and Written Opinion mailed Oct. 26, 2007 in PCT Appln. No. PCT/US2006/022675.

Search Report and Written Opinion mailed Sep. 21, 2007 in PCT Appln. No. PCT/US2006/022688.

Search Report and Written Opinion mailed Sep. 25, 2007 in PCT appln. No. PCT/US2006/022681.

Search Report and Written Opinion mailed Sep. 26, 2007 in PCT Appln. No. PCT/US2006/024218.

J. C. Palais, "Fiber optic communications," Prentice Hall, New Jersey, 1998, pp. 156-158.

Search Report and Written Opinion mailed Dec. 20, 2007 in PCT Appln. No. PCT/US2006/022771.

Search Report and Written Opinion mailed Jan. 31, 2008 in PCT Appln. No. PCT/US2006/027427.

Search Report and Written Opinion mailed Jan. 8, 2008 in PCT Appln. No. PCT/US2006/028741.

Search Report and Written Opinion mailed Mar. 11, 2008 in PCT Appln. No. PCT/US2006/022679.

Search Report and Written Opinion mailed Aug. 24, 2007 in PCT Appln. No. PCT/US2006/022768.

Search Report and Written Opinion mailed Aug. 31, 2007 in PCT Appln. No. PCT/US2006/022680.

Search Report and Written Opinion mailed Jul. 16, 2007 in PCT Appln. No. PCT/US2006/022774.

Search Report and Written Opinion mailed Jul. 20, 2007 in PCT Appln. No. PCT/US2006/024216.

Search Report and Written Opinion mailed Jul. 26, 2007 in PCT Appln. No. PCT/US2006/022776.

Search Report and Written Opinion mailed Jun. 20, 2007 in PCT Appln. No. PCT/US2006/022779.

Search Report and Written Opinion mailed Sep. 12, 2007 in PCT Appln. No. PCT/US2006/022767.

Search Report and Written Opinion mailed Sep. 13, 2007 in PCT Appln. No. PCT/US2006/024217.

Search Report and Written Opinion mailed Sep. 17, 2007 in PCT Appln. No. PCT/US2006/022787.

Search Report and Written Opinion mailed Sep. 5, 2007 in PCT Appln. No. PCT/US2006/027428.

Search Report and Written Opinion mailed Sep. 17, 2007 in PCT Appln. No. PCT/US2006/022689.

U.S. Appl. No. 11/418,082, filed May 5, 2006, Gorrell et al.

"An Early History - Invention of the Klystron," http://varianinc.com/cgi-bin/advprint/print.cgi?cid=KLQNPPJJFJ, printed on Dec. 26, 2008.

"An Early History - the Founding of Varian Associates," http://varianinc.com/cgi-bin/advprint/print.cgi?cid=KLQNPPJJFJ, printed on Dec. 26, 2008.

"Chapter 3 X-Ray Tube," http://compepid.tuskegee.edu/syllabi/clinical/small/radiology/chapter . . . , printed from tuskegee.edu on Dec. 29, 2008.

"Diagnostic imaging modalities - Ionizing vs non-ionizing radiation," http://info.med.yale.edu/intmed/cardio/imaging/techniques/ionizing_v . . . , printed from Yale University School of Medicine on Dec. 29, 2008.

"Frequently Asked Questions," Luxtera Inc., found at http://www.luxtera.com/technology_faq.htm, printed on Dec. 2, 2005, 4 pages.

"Klystron Amplifier," http://www.radartutorial.eu/08.transmitters/tx12.en.html, printed on Dec. 26, 2008.

"Klystron is a Micowave Generator," http://www2.slac.stanford.eduvvc/accelerators/klystron.html, printed on Dec. 26, 2008.

"Klystron," http:en.wikipedia.org/wiki/Klystron, printed on Dec. 26, 2008.

"Making X-rays," http://www.fnrfscience.cmu.ac.th/theory/radiation/xray-basics.html, printed on Dec. 29, 2008.

"Microwave Tubes," http://www.tpub.com/neets/book11/45b.htm, printed on Dec. 26, 2008.

"Notice of Allowability" mailed on Jan. 17, 2008 in U.S.Appl. No. 11/418,082 filed May 5, 2006.

"Technology Overview," Luxtera, Inc., found at http://www.luxtera.com/technology.htm, printed on Dec. 2, 2005, 1 page.

"The Reflex Klystron," http://www.fnrfscience.cmu.ac.th/theory/microwave/microwave%2, printed from Fast Netoron Research Facilty on Dec. 26, 2008.

"x-ray tube," http://www.answers.com/topic/x-ray-tube, printed on Dec. 29, 2008.

Mar. 6, 2009 Response to PTO Office Action of Sep. 16, 2008 in U.S. Appl. No. 11/18,085.

Mar. 17, 2008 PTO Office Action in U.S. Appl. No. 11/353,208.

Mar. 19, 2009 PTO Office Action in U.S. Appl. No. 11/411,120.

Mar. 24, 2006 PTO Office Action in U.S. Appl. No. 10/917,511.

Mar. 25, 2008 PTO Office Action in U.S. Appl. No. 11/411,131.

Mar. 26, 2009 Response to PTO Office Action of Sep. 26, 2008 in U.S. Appl. No. 11/410,905.

Mar. 31, 2008 PTO Office Action in U.S. Appl. No. 11/418,315.

Apr. 8, 2008 PTO Office Action in U.S. Appl. No. 11/325,571.

Apr. 11, 2008 PTO Office Action in U.S. Appl. No. 11/418,079.

Apr. 17, 2008 Response to PTO Office Action of Dec. 20, 2007 in U.S. Appl. No. 11/418,087.

Apr. 19, 2007 Response to PTO Office Action of Jan. 17, 2007 in U.S. Appl. No. 11/418,082.

May 10, 2005 PTO Office Action in U.S. Appl. No. 10/917,511.

May 21, 2007 PTO Office Action in U.S. Appl. No. 11/418,087.

May 26, 2006 Response to PTO Office Action of Mar. 24, 2006 in U.S. Appl. No. 10/917,511.

Jun. 11, 2008 PTO Office Action in U.S. Appl. No. 11/325,534.

Jun. 16, 2008 Response to PTO Office Action of Dec. 14, 2007 U.S. Appl. No. 11/418,264.

Jun. 20, 2008 PTO Office Action in U.S. Appl. No. 11/418,083.

Jun. 20, 2008 Response to PTO Office Action of Mar. 25, 2008 in U.S. Appl. No. 11/411,131.

Jul. 1, 2008 PTO Office Action in U.S. Appl. No. 11/418,244.

Aug. 10, 2007 PTO Office Action in U.S. Appl. No. 11/418,085.

Aug. 12, 2008 Response to PTO Office Action of Feb. 12, 2008 in U.S. Appl. No. 11/418,085.

Aug. 14, 2006 PTO Office Action in U.S. Appl. No. 10/917,511.

Sep. 1, 2006 Response to PTO Office Action of Aug. 14, 2006 in U.S. Appl. No. 10/917,511.

Sep. 12, 2005 Response to PTO Office Action of May 10, 2005 in U.S. Appl. No. 10/917,511.

Sep. 14, 2007 PTO Office Action in U.S. Appl. No. 11/411,131.

Sep. 15, 2008 Response to PTO Office Action of Mar. 17, 2008 in U.S. Appl. No. 11/353,208.

Sep. 16, 2008 PTO Office Action in U.S. Appl. No. 11/418,085.

Sep. 26, 2008 PTO Office Action in U.S. Appl. No. 11/410,905.

Oct. 7, 2008 Response to PTO Office Action of Apr. 11, 2008 in U.S. Appl. No. 11/418,079.

Oct. 15, 2008 Response to PTO Office Action of Jun. 11, 2008 in U.S. Appl. No. 11/325,534.

Oct. 19, 2007 Response to PTO Office Action of May 21, 2007 in U.S. Appl. No. 11/418,087.

Nov. 13, 2007 Response to PTO Office Action of Aug. 10, 2007 in U.S. Appl. No. 11/418,085.

Nov. 25, 2008 Response to PTO Office Action of Jul. 1, 2008 in U.S. Appl. No. 11/418,244.

Dec. 4, 2006 PTO Office Action in U.S. Appl. No. 11/418,087.

Dec. 14, 2007 PTO Office Action in U.S. Appl. No. 11/418,264.

Dec. 14, 2007 Response to PTO Office Action of Sep. 14, 2007 in U.S. Appl. No. 11/411,131.

Dec. 18, 2008 Response to PTO Office Action of Jun. 20, 2008 in U.S. Appl. No. 11/418,083.

Dec. 20, 2007 PTO Office Action in U.S. Appl. No. 11/418,087.

Dec. 24, 2008 PTO Office Action in U.S. Appl. No. 11/353,208.

Corcoran, Elizabeth, "Ride the Light," Forbes Magazine, Apr. 11, 2005, pp. 68- 70.

European Search Report mailed Mar. 27, 2009 in European Application No. 06852028.7.

Neo et al., "Smith-Purcell Radiation from Ultraviolet to Infrared Using a Si-field Emitter" Vacuum Electronics Conference, 2007, IVEC '07, IEEE International May 2007.

Ossia, Babak, "The X-Ray Production," Department of Biomedical Engineering - University of Rhode Island, 1 page.

Sadwick, Larry et al., "Microfabricated next-generation millimeter-wave power amplifiers," www.rfdesign.com Feb. 2004.

Saraph, Girish P. et al., "Design of a Single-Stage Depressed Collector for High-Power, Pulsed Gyroklystrom Amplifiers," IEEE Transactions on Electron Devices, vol. 45, No. 4, Apr. 1998, pp. 986-990.

Sartori, Gabriele, "CMOS Photonics Platform," Luxtera, Inc., Nov. 2005, 19 pages.

Search Report and Writen Opinion mailed Jul. 14, 2008 in PCT Appln. No. PCT/US2006/022773.

Search Report and Written Opinion mailed Aug. 19, 2008 in PCT Appln. No. PCT/US2007/008363.

Search Report and Written Opinion mailed Jul. 16, 2008 in PCT Appln. No. PCT/US2006/022766.

Search Report and Written Opinion mailed Jul. 28, 2008 in PCT Appln. No. PCT/US2006/022782.

Search Report and Written Opinion mailed Jul. 3, 2008 in PCT Appln. No. PCT/US2006/022690.

Search Report and Written Opinion mailed Jul. 3, 2008 in PCT Appln. No. PCT/US2006/022778.

Search Report and Written Opinion mailed Jul. 7, 2008 in PCT Appln. No. PCT/US2006/022686.

Search Report and Written Opinion mailed Jul. 7, 2008 in PCT Appln. No. PCT/US2006/022785.

Search Report and Written Opinion mailed Sep. 2, 2008 in PCT Appln. No. PCT/US2006/022769.

Search Report and Written Opinion mailed Sep. 26, 2008 in PCT Appln. No. PCT/US2007/00053.

Search Report and Written Opinion mailed Sep. 3, 2008 in PCT Appln. No. PCT/US2006/022770.

Thumm, Manfred, "Historical German Contributions to Physics and Applications of Electromagnetic Oscillations and Waves.".

U.S. Appl. No. 11/203,407 - Nov. 13, 2008 PTO Office Action.

U.S. Appl. No. 11/238,991 - Dec. 6, 2006 PTO Office Action.

U.S. Appl. No. 11/238,991 - Jun. 6, 2007 Response to PTO Office Action of Dec. 6, 2006.

U.S. Appl. No. 11/238,991 -Sep. 10, 2007 PTO Office Action.

U.S. Appl. No. 11/238,991 - Jun. 3, 2008 Response to PTO Office Action of Sep. 10, 2007.

U.S. Appl. No. 11/238,991 - Jun. 27, 2008 PTO Office Action.

U.S. Appl. No. 11/238,991 - Dec. 29, 2008 Response to PTO Office Action of Jun. 27, 2008.

U.S. Appl. No. 11/238,991 - Mar. 24, 2009 PTO Office Action.

U.S. Appl. No. 11/243,477 - Apr. 25, 2008 PTO Office Action •.

U.S. Appl. No. 11/243,477 - Oct. 24, 2008 Response to PTO Office Action of Apr. 25, 2008.

U.S. Appl. No. 11/243,477 - Jan. 7, 2009 PTO Office Action.

U.S. Appl. No. 11/325,448 - Jun. 16, 2008 PTO Office Action.

U.S. Appl. No. 11/325,448 - Dec. 16, 2008 Response to PTO Office Action of Jun. 16, 2008.

U.S. Appl. No. 11/353,208 - Jan. 15, 2008 PTO Office Action.

U.S. Appl. No. 11/353,208 - Dec. 30, 2008 Response to PTO Office Action of Dec. 24, 2008.

U.S. Appl. No. 11/400,280 - Oct. 16, 2008 PTO Office Action.

U.S. Appl. No. 11/400,280 - Oct. 24, 2008 Response to PTO Office Action of Oct. 16, 2008.
U.S. Appl. No. 11/410,924 - Mar. 6, 2009 PTO Office Action.
U.S. Appl. No. 11/411,129 - Jan. 16, 2009 Office Action.
U.S. Appl. No. 11/411,130 - May 1, 2008 PTO Office Action.
U.S. Appl. No. 11/411,130 - Oct. 29, 2008 Response to PTO Office Action of May 1, 2008.
U.S. Appl. No. 11/417,129 - Jul. 11, 2007 PTO Office Action.
U.S. Appl. No. 11/417,129 - Dec. 17, 2007 Response to PTO Office Action of Jul. 11, 2007.
U.S. Appl. No. 11/417,129 - Dec. 20, 2007 Response to PTO Office Action of Jul. 11, 2007.
U.S. Appl. No. 11/417,129 - Apr. 17, 2008 PTO Office Action.
U.S. Appl. No. 11/417,129 - Jun. 19, 2008 Response to PTO Office Action of Apr. 17, 2008.
U.S. Appl. No. 11/418,079 - Feb. 12, 2009 PTO Office Action.
U.S. Appl. No. 11/418,080 - Mar. 18, 2009 PTO Office Action.
U.S. Appl. No. 11/418,082 - Jan. 17, 2007 PTO Office Action.
U.S. Appl. No. 11/418,085 - Feb. 12, 2008 PTO Office Action.
U.S. Appl. No. 11/418,087 - Dec. 29, 2006 Response to PTO Office Action of Dec. 4, 2006.
U.S. Appl. No. 11/418,087 - Feb. 15, 2007 PTO Office Action.
U.S. Appl. No. 11/418,087 - Mar. 6, 2007 Response to PTO Office Action of Feb. 15, 2007.
U.S. Appl. No. 11/418,088 - Jun. 9, 2008 PTO Office Action.
U.S. Appl. No. 11/418,088 - Dec. 8, 2008 Response to PTO Office Action of Jun. 9, 2008.
U.S. Appl. No. 11/418,089 - Mar. 21, 2008 PTO Office Action.
U.S. Appl. No. 11/418,089 - Jun. 23, 2008 Response to PTO Office Action of Mar. 21, 2008.
U.S. Appl. No. 11/418,089 - Sep. 30, 2008 PTO Office Action .
U.S. Appl. No. 11/418,089 - Mar. 30, 2009 Response to PTO Office Action of Sep. 30, 2008.
U.S. Appl. No. 11/418,091 - Jul. 30, 2007 PTO Office Action.
U.S. Appl. No. 11/418,091 - Nov. 27, 2007 Response to PTO Office Action of Jul. 30, 2007.
U.S. Appl. No. 11/418,091 - Feb. 26, 2008 PTO Office Action.
U.S. Appl. No. 11/418,097 - Jun. 2, 2008 PTO Office Action.
U.S. Appl. No. 11/418,097 - Dec. 2, 2008 Response to PTO Office Action of Jun. 2, 2008.
U.S. Appl. No. 11/418,097 - Feb. 18, 2009 PTO Office Action.
U.S. Appl. No. 11/418,099 - Jun. 23, 2008 PTO Office Action.
U.S. Appl. No. 11/418,099 - Dec. 23, 2008 Response to PTO Office Action of Jun. 23, 2008.
U.S. Appl. No. 11/418,100 - Jan. 12, 2009 PTO Office Action.
U.S. Appl. No. 11/418,123 - Apr. 25, 2008 PTO Office Action.
U.S. Appl. No. 11/418,123 - Oct. 27, 2008 Response to PTO Office Action of Apr. 25, 2008.
U.S. Appl. No. 11/418,123 - Jan. 26, 2009 PTO Office Action.
U.S. Appl. No. 11/418,124 - Oct. 1, 2008 PTO Office Action.
U.S. Appl. No. 11/418,124 - Feb. 2, 2009 Response to PTO Office Action of Oct. 1, 2008.
U.S. Appl. No. 11/418,124 - Mar. 13, 2009 PTO Office Action.
U.S. Appl. No. 11/418,126 - Oct. 12, 2006 PTO Office Action.
U.S. Appl. No. 11/418,126 - Feb. 12, 2007 Response to PTO Office Action of Oct. 12, 2006 (Redacted).
U.S. Appl. No. 11/418,126 - Jun. 6, 2007 PTO Office Action.
U.S. Appl. No. 11/418,126 - Aug. 6, 2007 Response to PTO Office Action of Jun. 6, 2007.
U.S. Appl. No. 11/418,126 - Nov. 2, 2007 PTO Office Action.
U.S. Appl. No. 11/418,126 - Feb. 22, 2008 Response to PTO Office Action of Nov. 2, 2007.
U.S. Appl. No. 11/418,126 - Jun. 10, 2008 PTO Office Action.
U.S. Appl. No. 11/418,127 - Apr. 2, 2009 Office Action.
U.S. Appl. No. 11/418,128 - Dec. 16, 2008 PTO Office Action.
U.S. Appl. No. 11/418,128 - Dec. 31, 2008 Response to PTO Office Action of Dec. 16, 2008.
U.S. Appl. No. 11/418,128 - Feb. 17, 2009 PTO Office Action.
U.S. Appl. No. 11/418,129 - Dec. 16, 2008 Office Action.
U.S. Appl. No. 11/418,129 - Dec. 31, 2008 Response to PTO Office Action of Dec. 16, 2008.
U.S. Appl. No. 11/418,263 - Sep. 24, 2008 PTO Office Action.
U.S. Appl. No. 11/418,263 - Dec, 24, 2008 Response to PTO Office Action of Sep. 24, 2008.
U.S. Appl. No. 11/418,263 - Mar. 9, 2009 PTO Office Action.
U.S. Appl. No. 11/418,318 - Mar. 31, 2009 PTO Office Action.
U.S. Appl. No. 11/441,219 - Jan. 7, 2009 PTO Office Action.
U.S. Appl. No. 11/522,929 - Oct. 22, 2007 PTO Office Action.
U.S. Appl. No. 11/522,929 - Feb. 21, 2008 Response to PTO Office Action of Oct. 22, 2007.
U.S. Appl. No. 11/641,678 - Jul. 22, 2008 PTO Office Action.
U.S. Appl. No. 11/641,678 - Jan. 22, 2009 Response to Office Action of Jul. 22, 2008.
U.S. Appl. No. 11/711,000 - Mar. 6, 2009 PTO Office Action.
U.S. Appl. No. 11/716,552 - Feb. 12, 2009 Response to PTO Office Action of Feb. 9, 2009.
U.S. Appl. No. 11/716,552 - Jul. 3, 2008 PTO Office Action.
Whiteside, Andy et al., "Dramatic Power Savings using Depressed Collector IOT Transmitters in Digital and Analog Service.".

* cited by examiner

DETECTING PLASMONS USING A METALLURGICAL JUNCTION

COPYRIGHT NOTICE

A portion of the disclosure of this patent document contains material which is subject to copyright or mask work protection. The copyright or mask work owner has no objection to the facsimile reproduction by anyone of the patent document or the patent disclosure, as it appears in the Patent and Trademark Office patent file or records, but otherwise reserves all copyright or mask work rights whatsoever.

RELATED APPLICATIONS

The present invention is related to the following co-pending U.S. patent applications, each which is commonly owned with the present application at the time of filing, and the entire contents of each of which are incorporated herein by reference:

1. U.S. application Ser. No. 10/917,571, filed on Aug. 13, 2004, entitled "Patterning Thin Metal Film by Dry Reactive Ion Etching"
2. U.S. application Ser. No. 11/203,407, filed Aug. 15, 2005, entitled "Method of Patterning Ultra-Small Structures,"
3. U.S. application Ser. No. 11/243,476, filed Oct. 5, 2005, entitled, "Structure and Methods for Coupling Energy from an Electromagnetic Wave;"
4. U.S. application Ser. No. 11/243,477, filed Oct. 5, 2005, entitled, "Electron Beam Induced Resonance;"
5. U.S. application Ser. No. 11/238,991, filed Sep. 30, 2005, entitled, "Light Emitting Free-Electron Micro-Resonant Structure;"
6. U.S. application Ser. No. 11/302,471, filed Dec. 14, 2005, entitled, "Coupled Nano-Resonating Energy Emitting Structures;"
7. U.S. application Ser. No. 11/325,432, filed Jan. 5, 2006, entitled, "Resonant Structure-Based Display;"
8. U.S. application Ser. No. 11/325,448, filed Jan. 5, 2006, entitled, "Selectable Frequency Light Emitter;"
9. U.S. application Ser. No. 11/325,571, filed Jan. 5, 2006, entitled, "Switching Micro-Resonant Structures by Modulating a Beam of Charged Particles;" and
10. U.S. application Ser. No. 11/325,534, filed Jan. 5, 2006, entitled, "Switching Micro-Resonant Structures Using at Least One Director."

FIELD OF THE INVENTION

This relates in general to detector devices and, more particularly, to detector devices having a metallurgical junction.

INTRODUCTION AND BACKGROUND

Coupling energy from electromagnetic radiation in the frequency range from about 0.1 terahertz (THz) (3000 microns) to about 7 petahertz (PHz) (0.4 nanometers), referred to as the terahertz portion of the electromagnetic spectrum, is finding use in numerous new applications. These applications include improved detection of concealed weapons and explosives, forensics, improved medical imaging, detection of biological materials, better characterization of semiconductors; and broadening the available bandwidth for wireless communications.

In solid materials the detection of electromagnetic radiation starts with absorption, which is the mechanism for transferring energy from an electromagnetic (EM) wave to an electron-hole pair. In particular, photoconductor semiconductor devices use the absorption mechanism on receiving the EM wave and transfer the received energy via electron-hole pairs by band-to-band transitions. In addition, extrinsic photoconductor devices use the absorption mechanism and operate having transitions across the forbidden-gap energy levels (S. M., Sze, "Semiconductor Devices Physics and Technology", 2002, page 285).

Photodetectors include a range of semiconductor devices. These devices can include various types of photodiodes such as heterojunction, avalanche, P-I-N, and the like. The absorption coefficient is a property of a material and defines the extent to which the material absorbs energy in the form of electromagnetic radiation. Cut-off wavelength is the wavelength below which a material normally does not absorb electromagnetic radiation. Representative semiconductor materials such as Silicon(Si), Germanium (Ge) and Gallium Arsenide (GaAs) have cut-off wavelengths of about 1.1 microns, 1.9 microns and 0.87 microns, respectively. Hence, one particular semiconductor material normally cannot absorb energy in both the visible (i.e., about 0.39 microns to about 0.77 microns) and the infrared (i.e., about 0.77 microns to about 1 millimeter) portions of the electromagnetic spectrum.

In a given metal the electron density is normally substantially uniform. Variation or modulation of the electron density is referred to as a charge density wave. Plasmons are a form of the charge density waves. By one definition, the particle name for the charge density wave is a plasmon. A particular type of plasmon typically occurs at an interface between a metal and a dielectric, or between a semiconductor and a dielectric, and is referred to as a surface plasmon. Measurement of features on a surface at ultra-high sensitivity can employ the use of surface plasmons. For example, the technology for measuring a microbe or a virus has recently developed through the use of surface plasmon detection.

One method, called the minimum reflection method, for detecting surface plasmons includes directing an electromagnetic wave at an angle incident to a dielectric-metal or dielectric-semiconductor interface. Generally, the EM wave is reflected off the dielectric-metal interface. As the angle of the incident EM wave is varied, a particular angle is reached where the reflected EM wave is substantially zero. At this particular angle, energy of the incident EM wave is generally transferred to the surface plasmons or plasmons. Hence, the angle at which the reflected EM wave is minimum indicates the detection of plasmons. A so-called Kretschmann-Raether configuration applies the minimum reflection method (above) and provides easy access by employing a prism that contacts a metal or semiconductor layer. An electromagnetic wave passes through the prism and can reflect off the layer. An Otto arrangement disposes a prism a distance from an interface of the metal or semiconductor layer and detects plasmons again using the minimum reflection technique. This arrangement presents a disadvantage, because the interface is difficult to access with the detector. In yet another configuration, a corrugated surface or grating can be used to detect the minimum reflection of the EM wave. Another method for detecting plasmons collects an image of the reflected EM wave. The image can be processed using digital signal processing (DSP) to provide an angle of resonance within a few microns. This method is generally costly. In U.S. Pat. No. 5,792,667, plasmons are detected by measuring a temperature rise on the metal or semiconductor layer by using an ultra-thin-film thermometer. This method has the disadvantages of requiring ideal temperature control and precise calibration of the thermometer.

We describe a structure for receiving electromagnetic radiation, stimulating plasmons and generating a current on detecting the plasmons. This structure can be used as a plasmon detector. Optionally, the structure can be used to detect electromagnetic radiation over a broader range than any particular semiconductor detector. A plasmon source can be formed within a semiconductor device, such as a diode or transistor with a P-N junction. The plasmon source can include a transmission line, a microstructure, a micro-resonant structure having a cavity, a portion of metallization within a microcircuit, and the like. An electromagnetic wave can be received at the plasmon source, thereby stimulating plasmons. Fields are generated by the stimulated plasmons and coupled near the junction. The fields interact with a built-in electric field that typically occurs across the junction. This changes the band-gap and enables a current to couple through the structure.

BRIEF DESCRIPTION OF THE DRAWINGS

The following description, given with respect to the attached drawings, may be better understood with reference to the non-limiting examples of the drawings, wherein like reference numbers designate like elements, and wherein.

DETAILED DESCRIPTION OF THE PRESENTLY PREFERRED EXEMPLARY EMBODIMENTS

In general, an electromagnetic wave having a frequency below the plasma frequency of a metal is reflected. Electrons within the metal shield the electric field of the electromagnetic wave. On the other hand, an electromagnetic wave having a frequency above the plasma frequency is coupled through the metal. Here, the electrons are unable to respond fast enough to shield the metal from the electromagnetic wave. Silver (Ag) is a material having a plasma frequency of about 714 terahertz (0.42 microns) or in ultraviolet portion of the electromagnetic spectrum. Thus, silver reflects electromagnetic radiation over the entire visible portion of the spectrum and below. Gold (Au) has a plasma frequency in the blue portion of the visible spectrum around 612 terahertz (0.49 microns), and copper (Cu) has a plasma frequency of about 566 terahertz (0.53 microns) in the green portion of the visible spectrum. Hence, silver, gold and copper are at least some metals that interact with electromagnetic radiation within the visible portion of the electromagnetic spectrum and below.

In the following, references to plasmons are not limiting and can include the more general case of charge density waves.

Generally, devices and methods for detecting electromagnetic radiation and plasmons are described. A junction, such as a metallurgical junction or PN junction, is formed between two regions, which have distinct conductivity types. The junction creates an inherent field. A plasmon source is positioned generally near the junction and receives an electromagnetic wave. The plasmon source generates plasmons having a field. An interaction occurs between the inherent field and the field from the plasmons. This causes the band-gap to diminish and reduces the width of the depletion region. Hence, a current is coupled through the device and indicates energy in the form of plasmons is detected.

Figure 1:
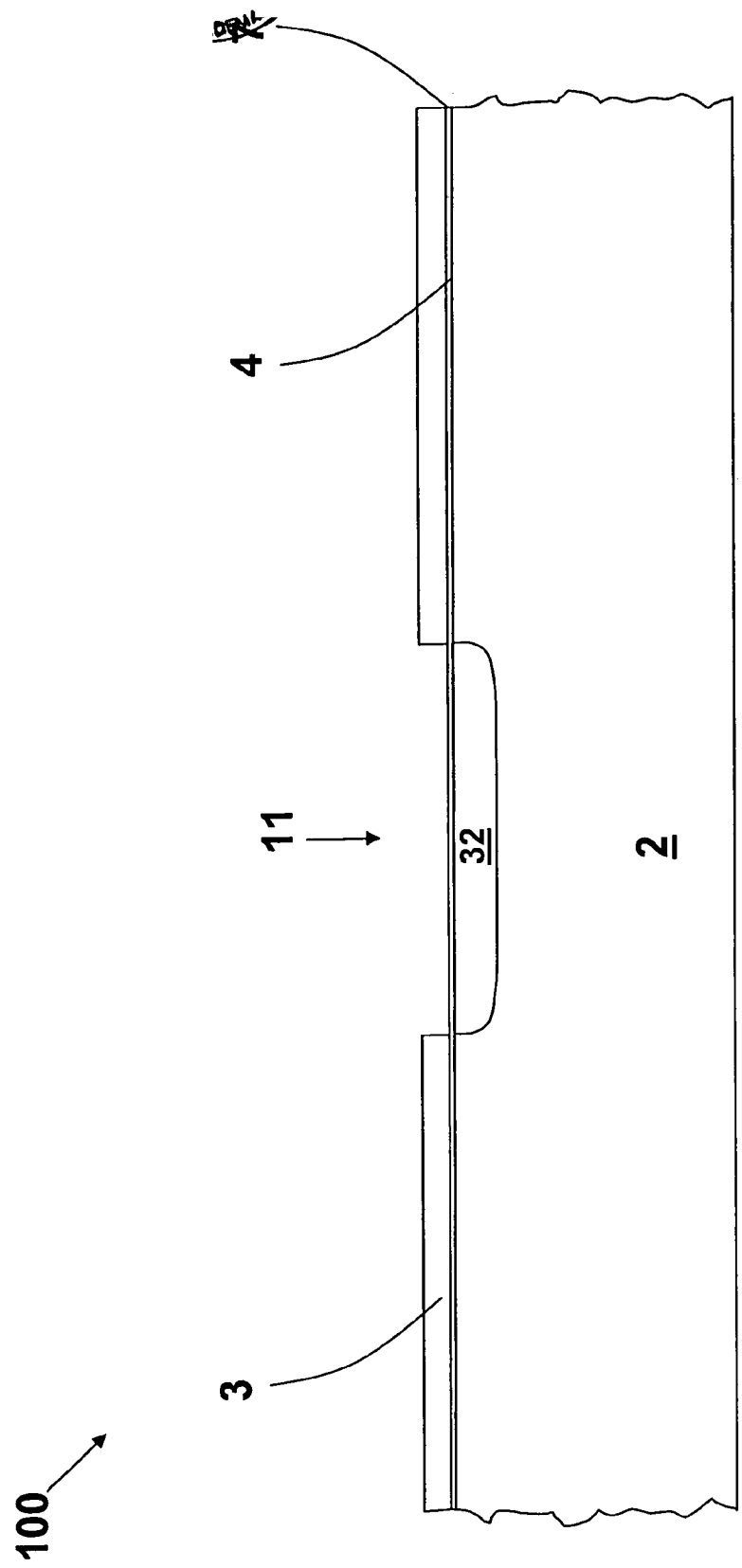
FIGS. 1-5 are enlarged cross-sectional side views showing the process steps of forming a detector device.

FIG. 1 is an enlarged cross-sectional side-view showing a portion of a semiconductor component 100 near the beginning of fabrication. For example, a thin layer of a dielectric material can be formed on a major surface 4 of a substrate 2. The dielectric layer, commonly referred to as a screen oxide 7, can have a thickness of approximately 20 nanometers. The screen oxide 7 is a sacrificial layer that serves to collect dislodged particles resulting from subsequent processing employing an ion-implantation beam. The screen oxide 7 typically randomly scatters the beam to reduce channeling. A photoresist layer 3, for example, can be patterned having an opening 11 which exposes a portion of the screen oxide 7. Ion-implantation can be used to introduce a dopant into the substrate 2 to form a region 32. The dopant can include any suitable impurity material such as arsenic, antimony, phosphorus, or the like. In another embodiment (not shown), a dopant can be introduced using a diffusion method, without a screen oxide. Various diffusion techniques can be used and are well known to those skilled in the art. The substrate 2 can include compound semiconductors, silicon-on-insulator, silicon-on-sapphire, silicon-on-spinel, silicon-on-nitride, silicon-on-oxide, and the like. The type of material for making the substrate 2 and the method of introducing a dopant are not limiting.

Figure 2:
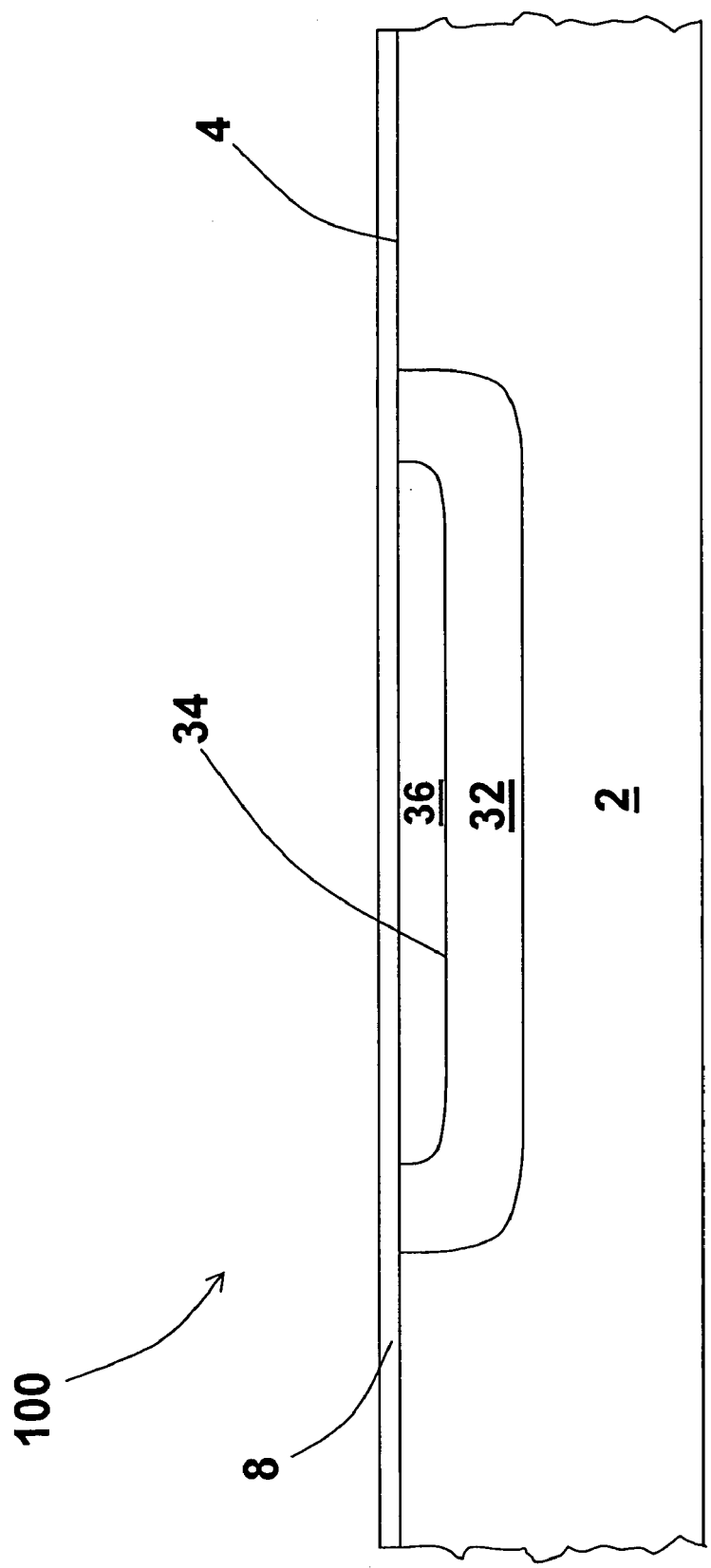

FIG. 2 shows a portion of the device 100 after a drive-in oxidation step. The dopant comprising region 32 is driven deeper into the substrate 2 using various diffusion techniques well known to those in the art. For example, a wet or dry oxidation process step can be used. Similar to the process shown for FIG. 1, another dopant of an opposite conductivity type is introduced into the substrate 2 to form a region 36 above the region 32. This dopant can include any suitable impurity material such as boron, or the like. The photoresist 3 and screen oxide 7 are removed after the implantation steps. A final drive-in oxidation step can be used to redistribute the dopants of regions 32 and 36 and forms a dielectric layer 8. Some depletion of the dopant in region 36 can occur in the process of growing the dielectric layer 8. For this reason, the initial dose of the dopant in region 36 should allow for some loss in impurity concentration. After the final drive-in oxidation step, a junction 34 is established between the regions 32 and 36. The formation of dielectric layer 8 can include using other techniques such as chemical vapor deposition (CVD) and plasma enhanced vapor deposition (PECVD) and is not limiting.

Figure 3:
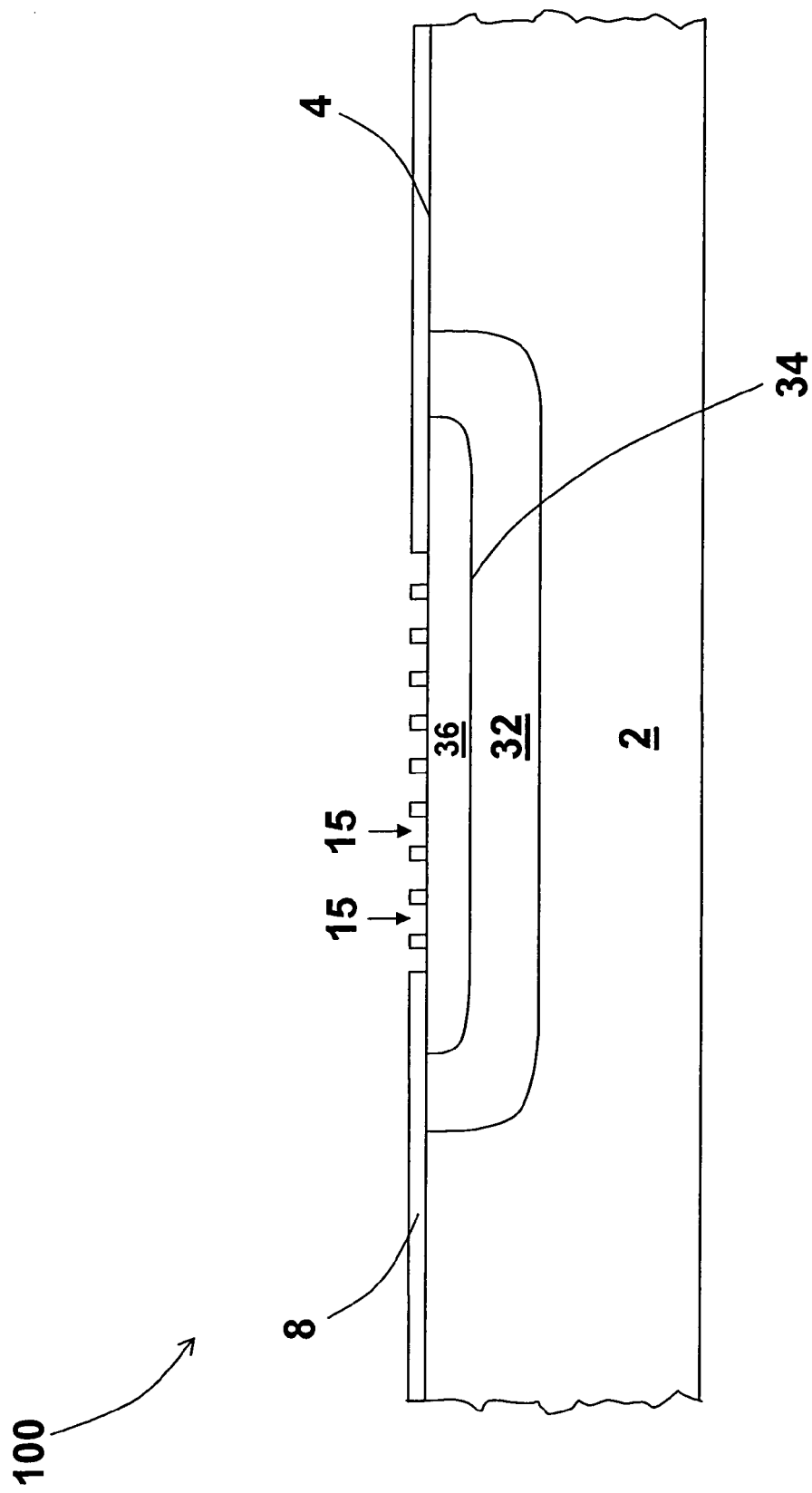

FIG. 3 shows a portion the device 100 after further processing. A photoresist (not shown) is patterned and formed on the dielectric layer 8. Openings 15 are etched through the dielectric layer 8.

Figure 4:
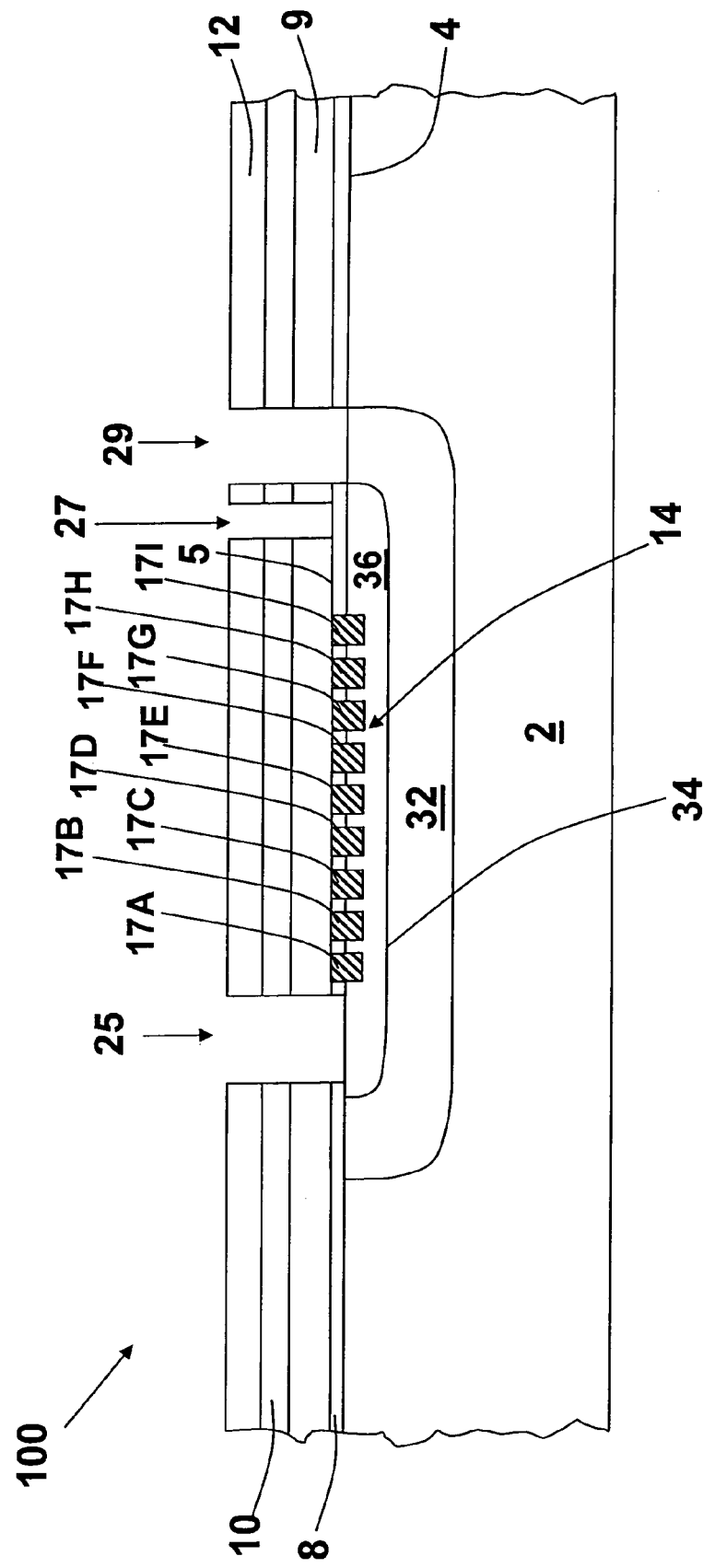

Referring now to FIG. 4, a plasmon source 14 is formed. The plasmon source can include a transmission line, a microstructure, a micro-resonant structure having a cavity, a portion of metallization within a microcircuit, and is not limiting. The plasmon source 14 can be formed on either side of the junction 34. The plasmon source 14 can include resonant, sub-wavelength and wavelength structures and can be sized to a multiple of the wavelength. The shape of the plasmon source 14 can include spherical, cubical, triangular-pyramidal and the like. In another embodiment (not shown), a plasmon source can extend over a range of distances from a junction and is not limiting. In yet another embodiment (not shown), a device, such as a transistor, can include a plasmon source near a junction and is not limiting as to the type of device. Portions of the region 36 exposed by the openings 15, shown in FIG. 3, are etched away using, for example, an anisotropic reactive ion etch. As shown in FIG. 4, the plasmon source 14 comprises microstructures 17A-17I and is formed above the junction 34. The microstructures 17A through 17I are formed in the etched away portions of the region 36 and fill up to a surface 5 of the dielectric layer 8 using, e.g., techniques described above. The microstructures 17A-17I can be made using materials that include at least gold, silver, copper, aluminum and the like.

A dielectric layer 9 is formed on the microstructures 17A-17I and the dielectric layer 8. The index of refraction of the dielectric layer 9 should be greater than the index of refraction of the dielectric layer 8. Generally, the preferred thickness of the dielectric layer 9 can include a broad range of thicknesses. For example, the thickness of the dielectric layer 9 can include a range of thicknesses from about 750 Angstroms to about 3,000 Angstroms. The material for the dielectric layer 9 can include various transparent or translucent materials such as silicon oxide, silicon carbide, and the like. The dielectric layer 9 can be formed using techniques commonly known in the semiconductor industry. These techniques can include various forms of chemical vapor deposition (CVD) and plasma enhanced vapor deposition (PECVD). The material and technique for making the dielectric layer 9 can take a variety of forms and is not limiting. The dielectric layer 9 can be planarized using Chemical Mechanical Polishing (CMP).

A dielectric layer 10 is formed on the dielectric layer 9. The index of refraction of the dielectric layer 10 should be less than the index of refraction of the dielectric layer 9. The thickness of dielectric layer 10 can be similar to the thickness of the dielectric layer 9.

A dielectric layer 12 is formed on the dielectric layer 10 to provide isolation and has an index of refraction less than the dielectric layer 9. A photoresist layer (not shown) is patterned on the dielectric layer 12 to form openings 25 and 29 using techniques well known to those skilled in the art. For example, the opening 25 and 29 can be formed using an anisotropic reactive ion etch that stops on the surface 4. An opening 27 can be similarly formed to stop on the dielectric layer 8.

Figure 5:
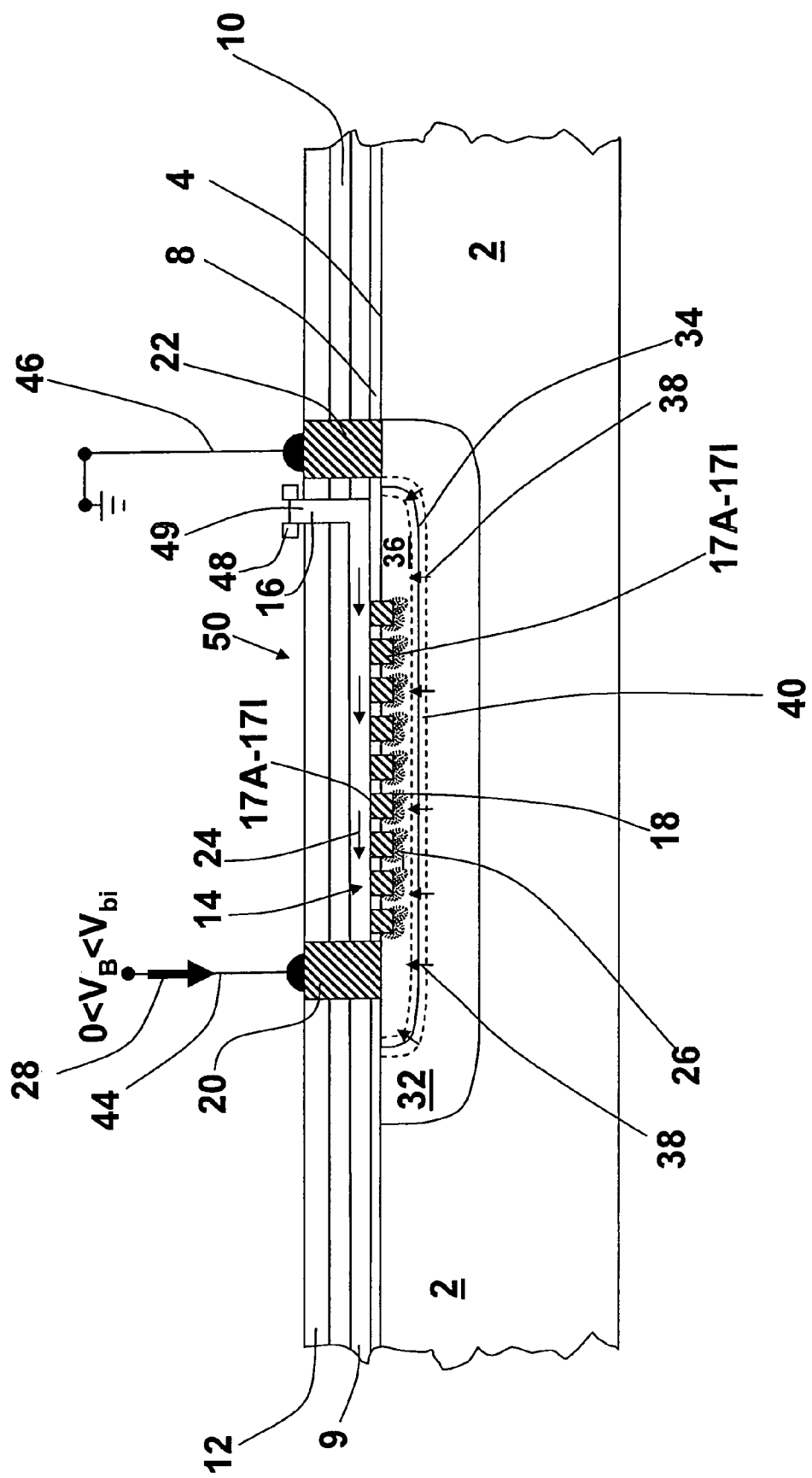

In FIG. 5, metallization 20 and 22 fills the respective openings 25 and 29 (see FIG. 4). A dielectric material 16 is formed in the opening 27 (see FIG. 4) using various techniques such as chemical vapor deposition (CVD) and plasma enhanced vapor deposition (PECVD). The dielectric material 16 should have an index of refraction similar to the index of refraction of the dielectric layer 9. The metallization 20 and 22 electrically connects to regions 36 and 32, respectively. The microstructures 17A-17I are shown in FIG. 5 respectively from left to right.

The dopant of region 32 provides excess carriers (e.g., electrons) that diffuse from the region 32 and combine with carriers (e.g., holes) in the region 36. In addition, the dopant from region 36 provides excess carriers (e.g., holes) that travel or diffuse and combine with carriers (e.g., electrons) in the region 32. This substantially reduces the population of carriers in a portion of the respective regions 32 and 36 in the vicinity of the junction 34. Hence, a portion of the regions 32 and 36 within the dashed lines shown near junction 34 is commonly referred to as a depletion region 40. Further, a portion of the carriers reaching their respective regions 32 and 36 across the junction 34 do not combine. These non-combining carriers are referred to as uncovered charges, which form space charge regions on each side of the junction 34. The uncovered charges generate an inherent field 38, which is directed from the uncovered charges (e.g., holes) across the junction 34. A potential barrier or built-in voltage $V_{bi}$ occurs across the junction 34 from the inherent field 38, and for silicon is about 0.6 volt.

Electrodes 44 and 46 are formed on the respective metallization 20 and 22. The electrode 46 is shown connected to ground. A voltage source (not shown) is connected to the electrode 44. An applied voltage $V_B$ from the voltage source is generally within a range from about zero volts to a voltage of less than the built-in voltage $V_{bi}$ such that a current does not couple across the junction 34.

A coupler 50 is for coupling an electromagnetic wave 24 (EM wave) to the microstructures 17A-17I and includes the dielectric material 16 and a portion of the dielectric layers 8, 9, 10 and 12. The dielectric layer 9 and the dielectric material 16 can serve as the core of the coupler 50. The dielectric layers 8, 10 and 12 function as the coupler's 50 cladding. The EM wave 24, shown traveling through the dielectric layer 9 of the coupler 50, can be provided by an external source (not shown) coupled to an end 49 of the coupler 50. A ferrule 48 as shown can be used to connect the external source to the coupler 50.

At least a portion of the microstructures 17A-17I is exposed to the core or the dielectric layer 9, which carries the EM wave 24. An interaction between the EM wave 24 and the microstructures 17A-17I stimulate plasmons having fields 26. The fields 26 can be intensified or concentrated at the corners 18 of the microstructures 17A-17I. By changing the size, shape and material of the microstructures 17A-17I, the EM wave 24 can interact with the microstructures 17A-17I over a range of frequencies.

The fields 26 from the microstructures 17A-17I can buck or oppose the inherent field 38 across the junction 34. As a result, the band-gap is reduced, thereby allowing a current 28 to flow across the junction 34 and through the device 100. Hence, the current 28 is generated on detecting the plasmons. This provides an alternative method for detecting plasmons. Further, as mentioned above, no particular semiconductor can absorb electromagnetic radiation across the entire visible portion of the electromagnetic spectrum and below. In contrast, silver, for example, interacts with electromagnetic radiation generally across the visible spectrum and below. Thus, the device 100 can be formed using the microstructures 17A-17I made from silver, or a number of other materials that interact with electromagnetic radiation. The device 100 provides the advantage of using one structure to cover the entire visible spectrum and below. In contrast, semiconductor devices that use absorption to detect electromagnetic radiation cannot continuously function over the visible spectrum and below. Further, the response speed of semiconductor detectors is limited. Carriers within a semiconductor detector that are generated outside the depletion region are delayed, because they must travel to the junction. For this reason and to increase the absorption area, the width of the depletion region is typically increased. However, too wide a depletion region can also result in an increase of the travel-time of the carriers. In contrast, if the depletion region is biased too thin, capacitance will increase causing the response of the semiconductor detector to increase (S. M., Sze, "Semiconductor Devices Physics and Technology", 2002, page 315).

Figure 6:
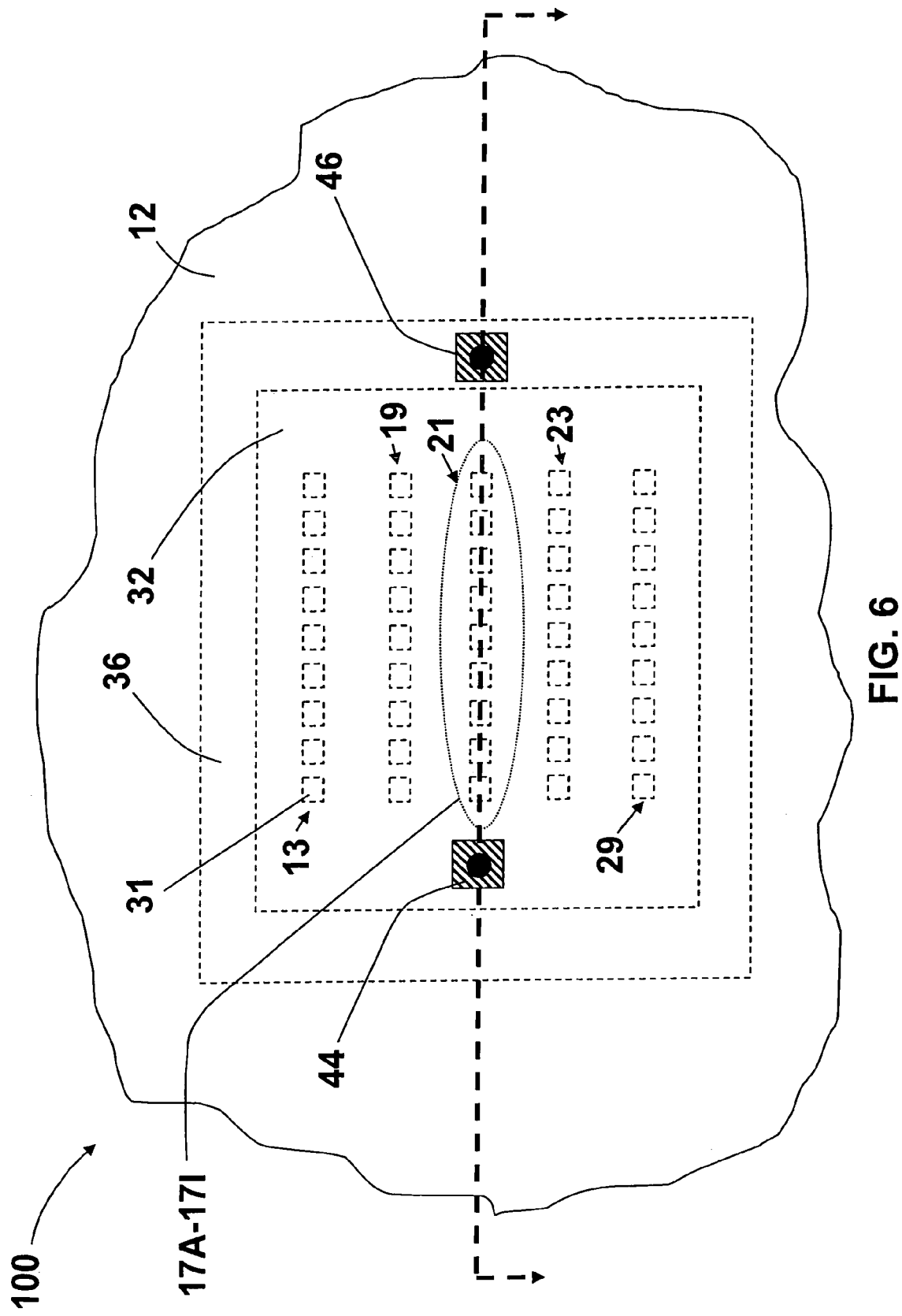
FIG. 6 is an enlarged top-view of the detector device of FIG. 5.

FIG. 6 is an enlarged top-view of the device 100 shown in FIG. 5. FIG. 6 illustrates a microstructure array 31 forming rows 13, 19, 21, 23 and 29. In row 21, the microstructures 17A-17I are shown respectively from left to right. Electrodes 44 and 46 for respectively connecting to a voltage source and to ground are shown.

Figure 7:
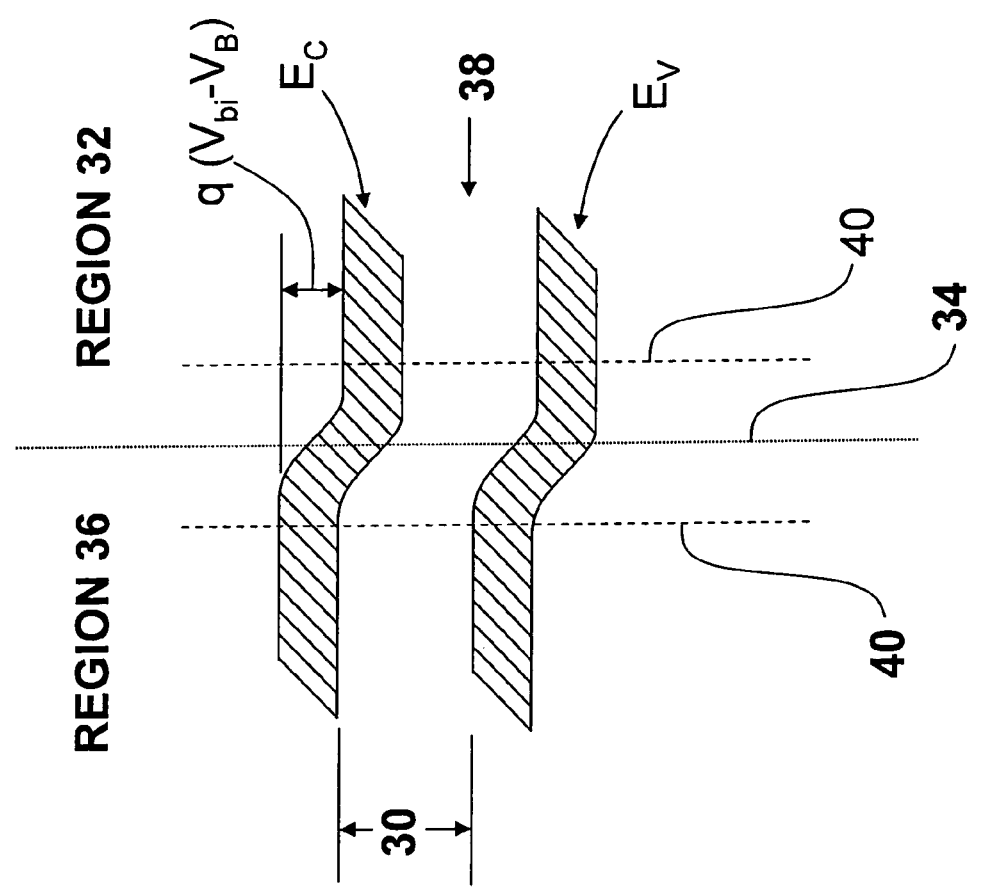
FIG. 7 is a diagram showing a band-gap of the detector device under bias.

FIG. 7 is an energy diagram of a band-gap 30 between the top of the valence band EV and the bottom of the conduction band EC shown at an applied voltage of $V_B$. Regions 32 and 36, junction 34 and the boundaries of the depletion region 40 are overlaid on the energy diagram. The applied voltage $V_B$ is shown connected to the electrode 44 in FIG. 5 and has a magnitude between zero and the built-in potential $V_{bi}$, (i.e., $0<V_B<V_{bi}$). The applied voltage $V_B$ provides a potential energy difference (i.e., q $(V_{bi}-V_B)$) across the junction 34. The energy difference across the junction 34 is the charge (q) (e.g., coulombs) multiplied by built-in voltage $V_{bi}$ minus the applied voltage $V_B$ (e.g., joule/coulomb). This decreases the total electrostatic potential across the junction 34 by the applied voltage $V_B$. For example, a voltage of 0.3 volt is applied to the electrode 44 and opposes a built-in voltage $V_{bi}$ of 0.6 resulting in a voltage of about 0.3 volt across the junction 34. The band-gap 30 is a function of a number of variables including the net electrostatic potential across the junction 34. The band-gap 30 can be increased or decreased by an applied voltage across the device 100. Here, the band-gap 30 is reduced by the applied voltage $V_B$, because the field from the applied voltage $V_B$ opposes the inherent field 38 of the built-in voltage $V_{bi}$. For current to begin to flow, a carrier (e.g., electron) needs sufficient energy to reach the lowest energy level of the conduction band $E_c$. In other words, the carrier needs to overcome the energy difference (i.e., q $(V_{bi}-V_B)$) across the junction 34.

Figure 8:
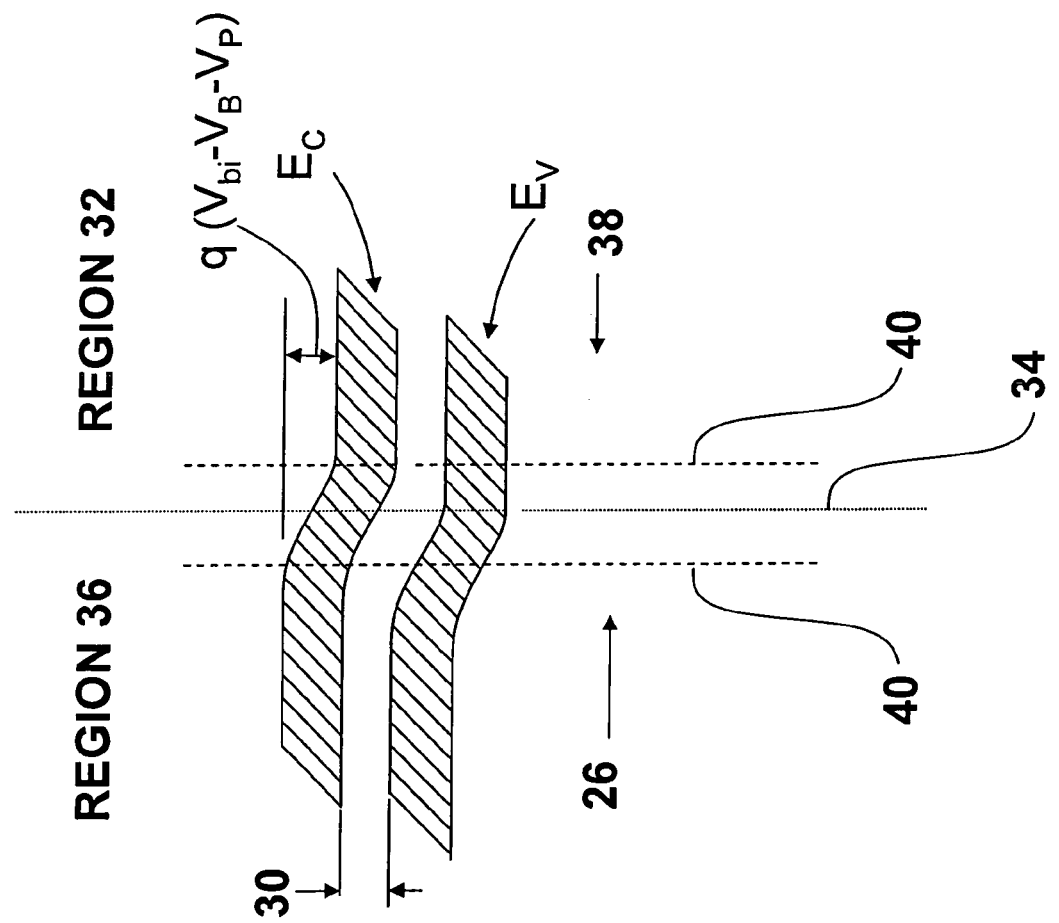
FIG. 8 is a diagram of the detector device showing a reduced band-gap under bias and receiving an EM wave.

FIG. 8 is an energy diagram of the device 100 illustrating a reduced band-gap 30 on receiving the EM wave 24. The EM wave 24, as mentioned, stimulates plasmons that generate the field 26, which reduces the band-gap 30. In other words, the field 26 opposes the inherent field 38, thereby reducing the band-gap 30. The field 26 introduces a plasmon voltage $V_P$. The corresponding potential energy difference (i.e., q $(V_{bi}-V_B-V_P)$) across the junction 34 is decreased by the plasmon voltage $V_P$. Carriers (e.g., electrons) can now overcome the potential energy difference across the junction 34. Thus, the current 28 flows across the junction 34 and through the device 100.

Methods of making a device for detecting an electromagnetic wave as can be employed herein may use, e.g., the techniques described in related U.S. applications Ser. Nos. 10/917,571 and/or 11/203,407, each of which is described in greater detail above.

The devices described herein may also employ various similar or different example resonant structures like those described in one or more of the following, related applications, each of which was described in greater detail above: U.S. applications Ser. Nos. 11/243,476; 11/243,477; 11/238,991; 11/302,471; 11/325,432; 11/325,448; 11/325,571 and 11/325,534.

Thus are described devices and methods that detect plasmons. A metallurgical junction is formed and provides an inherent field across the junction. A built-in voltage results from the inherent field. A band-gap is established. The metallurgical junction can be biased between zero and the built-in voltage. A plasmon source is formed near the junction. An electromagnetic wave is received and channeled to expose the plasmon source, and plasmons are stimulated. A field occurs from the stimulated plasmons that oppose the inherent field. A net electrostatic potential across the junction is reduced. Thus, the band-gap is reduced, and a current is coupled across the junction and through the device on detecting the plasmons.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A device for detecting the presence of plasmons in response to electromagnetic radiation, comprising:
    a substrate having first and second regions of first and second conductivity types, respectively;
    a voltage source establishing a voltage difference between the first and second regions;
    a junction region between the first and second regions having a band-gap that in an undetecting state limits current flow between the first and second regions and creates an inherent field;
    a plasmon source near the junction to receive the electromagnetic radiation and thereby be stimulated by the electromagnetic radiation to generate plasmons having second fields that oppose the inherent field to reduce the band-gap to enable a current to flow between the first and second regions as a detection of the presence of the plasmons, the plasmon source including a plurality of microstructures of metallic material; and
    a first dielectric layer formed on the first region of the substrate, the plurality of microstructures being formed into both the first region of the substrate and the first dielectric layer.

2. The device of claim 1, further including a first dielectric layer formed on the first region of the substrate.

3. The device of claim 2, further including a second dielectric layer formed on the first dielectric layer to sandwich the first dielectric layer between the second dielectric layer and the first region of the substrate, the second dielectric layer having an index of refraction greater than the first dielectric layer.

4. The device of claim 3, further including a third dielectric layer formed on the second dielectric layer to sandwich the second dielectric layer between the first dielectric layer and the third dielectric layer, the third dielectric layer having an index of refraction less than the second dielectric layer.

5. The device of claim 4, wherein portions of the first, second and third dielectric layers respectively form first and second openings, the device further including first and second metallization fillings, respectively in the first and second openings.

6. The device of claim 5, wherein the first metallization filling is electrically coupled to the first region of the substrate and the second metallization filling is electrically coupled to the second region of the substrate.

7. The device of claim 6, further including first and second electrodes electrically connected to, respectively, the first and second metallization fillings, the voltage difference being established between, respectively the first and second electrodes.

8. The device of claim 7, wherein the plasmon source includes a plurality of microstructures of metallic material.

9. The device of claim 8, wherein the microstructures are formed into both the first region of the substrate and the first dielectric layer.

10. The device of claim 9 further including a core region sandwiched between the first and third dielectric layers to channel the electromagnetic wave near the microstructures.

\* \* \* \* \*